United States Patent
Chandra et al.

(10) Patent No.: US 8,339,876 B2
(45) Date of Patent: Dec. 25, 2012

(54) MEMORY WITH IMPROVED READ STABILITY

(75) Inventors: Vikas Chandra, Fremont, CA (US); Satyanand Vijay Nalam, Charlottesville, VA (US); Cezary Pietrzyk, Los Gatos, CA (US); Robert Campbell Aitken, San Jose, CA (US)

(73) Assignee: ARM Limited, Cambridge (GB)

( * ) Notice: Subject to any disclaimer, the term of this patent is extended or adjusted under 35 U.S.C. 154(b) by 414 days.

(21) Appl. No.: 12/591,127

(22) Filed: Nov. 9, 2009

(65) Prior Publication Data

US 2011/0085391 A1    Apr. 14, 2011

Related U.S. Application Data

(60) Provisional application No. 61/249,818, filed on Oct. 8, 2009.

(51) Int. Cl.
*G11C 7/00* (2006.01)

(52) U.S. Cl. .................. 365/189.17; 365/154; 365/210

(58) Field of Classification Search ............. 365/189.17, 365/210, 154, 156, 189.07, 185.08, 185.25, 365/189.16

See application file for complete search history.

(56) References Cited

U.S. PATENT DOCUMENTS

| | | | | |
|---|---|---|---|---|
| 5,717,638 | A * | 2/1998 | Kim | 365/189.04 |
| 5,880,988 | A * | 3/1999 | Bertin et al. | 365/63 |
| 7,053,652 | B1 * | 5/2006 | de Jong | 326/41 |
| 2009/0185435 | A1 * | 7/2009 | Adams et al. | 365/189.14 |

OTHER PUBLICATIONS

C. Wang et al, "A Boosted Wordline Voltage Generator for Low-Voltage Memories" ICECS-2003, 2003, pp. 806-809.
E. Grossar et al, "Read Stability and Write-Ability Analysis of SRAM Cells for Nanometer Technologies" *IEEE Journal of Solid-State Circuits*, vol. 41, No. 11, Nov. 2006, pp. 2577-2588.
B. Calhoun et al, "A 256-kb 65-nm Sub-threshold SRAM Design for Ultra-Low-Voltage Operation" *IEEE Journal of Solid-State Circuits*, vol. 42, No. 3, Mar. 2007, pp. 680-688.
I. Carlson et al, "A High Density, Low Leakage, 5T SRAM for Embedded Caches" IEEE, 2004, pp. 215-218.
L. Chang et al, "A 5.3GHz 8T-SRAM with Operation Down to 0.41V in 65nm CMOS" 2007 *Symposium on VLSI Circuits Digest of Technical Papers*, 2007, pp. 252-253.
B. Cheng et al, "The Scalability of 8T-SRAM Cells under the Influence of Intrinsic Parameter Functuations" IEEE, 2007, pp. 93-96.
W. Dehaene et al, "Embedded SRAM design in deep deep submicron technologies" IEEE, 2007, pp. 384-391.

(Continued)

*Primary Examiner* — Dang Nguyen
(74) *Attorney, Agent, or Firm* — Nixon & Vanderhye P.C.

(57) ABSTRACT

A static random access memory (SRAM) includes a data line for transferring data to and from the memory and at least one reset line, a plurality of storage cells, each cell including an asymmetric feedback loop; an access device for selectively providing a connection between the at data line and the cell's first access node; a reset device for selectively providing a connection between a reset line and the cell's second access node. The SRAM further includes data access control circuitry for generating control signals for independently controlling the access device and the reset device and to generate a data access control signal. The SRAM also generates a reset control signal to trigger the reset device to provide the connection between the at least one reset line and the second access node in response to a write request to write the complementary predetermined value to the storage cell.

16 Claims, 9 Drawing Sheets

Split bitline sensing scheme for 5T cell

OTHER PUBLICATIONS

R. Hobson, "A New Single-Ended SRAM Cell With Write-Assist" *IEEE Transactions on Very Large Scale Integration (VLSI) Systems*, vol. 15, No. 2, Feb. 2007, pp. 173-181.

J. Wang et al, "Analyzing Static and Dynamic Write Margin for Nanometer SRAMs" *ISLPED '08*, Aug. 2008, pp. 129-134.

A. Kawasumi et al, "A Single-Power-Supply 0.7V 1GHz 45nm SRAM with an Asymmetrical Unit-β-ratio Memory Cell" *2008 IEEE International Solid-State Circuits Conference*, 2008, pp. 382, 383, 622.

M. Khellah et al, "Read and Write Circuit Assist Techniques for Improving Vccmin of Dense 6T SRAM Cell" *IEEE Intl Conf. on Integrated Circuit Design and Technology*, 2008.

J. Kulkarni et al, "A 160 mV Robust Schmitt Trigger Based Sub-threshold SRAM" *IEEE Journal of Solid-State Circuits*; vol. 42, No. 10, Oct. 2007, pp. 2303-2313.

R. Kumar et al, "A Family of 45nm IA Processors" *2009 IEEE International Solid-State Circuits Conference*, 2009, pp. 58-59.

S. Nalam et al, "Asymmetric Sizing in a 45nm 5T SRAM to Improve Read Stability over 6T" *IEEE 2009 Custom Intergrated Circuits Conference (CICC)*, 2009, pp. 709-712.

H. Pilo et al, "An SRAM Design in 65-nm Technology Node Featuring Read and Write-Assist Circuits to Expand Operating Voltage" *IEEE Journal of Solid-State Circuits*, vol. 42, No. 4, Apr. 2007, pp. 813-819.

J. Poulton, "An Embedded DRAM for CMOS ASICs" IEEE, 1997, pp. 288-302.

E. Seevinck et al, "Static-Noise Margin Analysis of MOS SRAM Cells" *IEEE Journal of Solid-State Circuits*, vol. SC-22, No. 5, Oct. 1987, pp. 748-754.

T. Suzuki et al, "A Stable 2-Port SRAM Cell Design Against Simultaneously Read/Write-Disturbed Accesses" *IEEE Journal of Solid-State Circuits*, vol. 43, No. 9, Sep. 2008 pp. 2109-2119.

Y. Ye et al, "Evaluation of Differential vs. Single-Ended Sensing and Asymmetric Cells in 90nm Logic Technology for On-Chip Caches" *ISCAS 2006*, pp. 963-966.

Y. Kim et al, "New SRAM Cell Design for Low Power and High Reliability using 32nm Independent Gate FinFET Technology" *IEEE International Workshop on Design and Test of Nano Devices, Circuits and Systems*, 2008, pp. 25-28.

M. Iijima et al, "Low Power SRAM with Boost Driver Generating Pulsed Word Line Voltage for Sub-1V Operation" *Journal of Computers*, vol. 3, No. 5, May 2008, pp. 34-40.

H. Morimura et al, "A Step-Down Boosted-Wordline Scheme for 1-V Battery-Operated Fast SRAM's" *IEEE Journal of Solid-State Circuits*, vol. 33, No. 8, Aug. 1998, pp. 1220-1227.

\* cited by examiner

Conventional 6T SRAM bitcell

FIG. 1 (Prior Art)

5T bitcell

Timing diagram for (a) Write '1' and (b) Write '0' operations

Split bitline sensing scheme for 5T cell

FIG. 7

Timing diagram for (a) Read '1' and (b) Read '0' operations

Alternative implementation of the proposed bitcell.
The width and height of the cell increase by δh and δw.
This leads to an area overhead of 16% when both cells follow logic DRC rules.

MEMORY WITH IMPROVED READ STABILITY

This application claims the benefit of U.S. Provisional Application No. 61/249,818 filed 8 Oct. 2009, the entire contents of each of which are hereby incorporated by reference.

BACKGROUND OF THE INVENTION

1. Field of the Invention

The field of the invention relates to the field of data storage and in particular, to the storage and access of data in semiconductor memories.

2. Description of the Prior Art

There is a desire to reduce the size and power consumption of a memory. However, as the devices forming a memory and their power consumption reduce, their robustness to corruption tends to decrease. It is becoming increasingly challenging to design robust semiconductor memories such as SRAM that are both small and consume low power.

As dimensions scale down the variations in device property due to random dopant fluctuations, line edge roughness etc. increase drastically. Thus, designing a robust SRAM with these smaller dimensions where cells can be read (without read disturb) and written to across all operational voltage ranges turns out to be very difficult.

Figure 1:
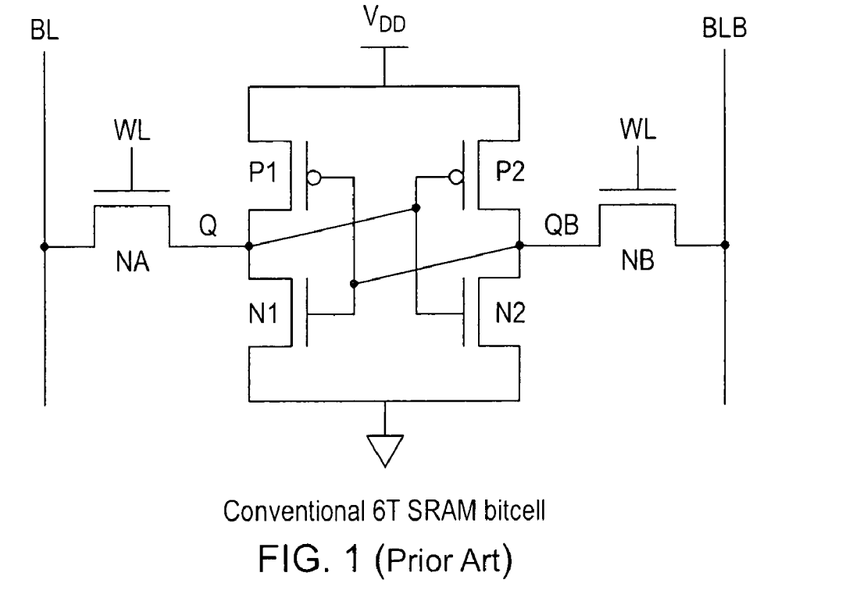
FIG. 1 shows a conventional 6T SRAM bit cell according to the prior art.

Several different designs for the bitcells forming an SRAM memory have been proposed to improve their robustness. A conventional SRAM memory cell is shown in FIG. 1. It has six transistors, two pass gate transistors NA and NB and four transistors that form a feedback loop for storing the data value. A bit line and complementary bit line feed data to and from the cell and the word line is used to provide the cell with access to the bit lines. In order to be able to write to the bit cell the input voltage must be high enough to switch the state of the cell if required, whilst when reading the state needs to remain uncorrupted.

Various different bit cells have been proposed that are more robust to read and or write operations. These tend to have additional transistors and thus, 7 transistor and 8 transistor bit cells are known that are more robust but take more area.

Figure 2:
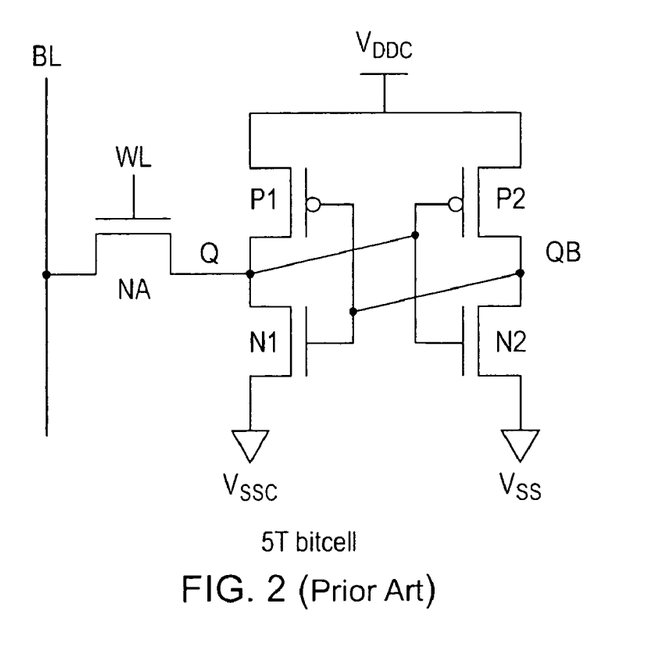
FIG. 2 shows a 5T bit cell according to the prior art.

A five transistor bit cell is described in Nalam et al. "Asymmetric Sizing in a 45 nm 5T SRAM to Improve Read Stability over 6T" from Custom Integrated Circuits conference 2009 and is shown in FIG. 2. This 5T bit cell is asymmetrically sized to improve the read static noise margin. However, as data is only input from one side it is more difficult to switch the state when writing to the cell than is the case in the 6T cell. This is addressed by collapsing the VDDC powering the feedback loop and boosting the voltage on the word line to strengthen the access transistor during a write. The write noise margin is still inferior to the six transistor cell and requires a large voltage swing in both the voltage on the word line and on VDDC. Thus, although the five transistor cell could potentially provide area savings the irregular structure and need for write assist methods detract from these area benefits.

It would be desirable to increase the robustness of a memory to read and write margins without unduly increasing its area.

SUMMARY OF THE INVENTION

A first aspect of the present invention provides a static random access memory, SRAM comprising: at least one data line for transferring data to and from said memory and at least one reset line; a plurality of storage cells each being arranged for connection to said at least one data line and said at least one reset line, each storage cell comprising: an asymmetric feedback loop, said feedback loop comprising a first access node for holding a data value when said feedback loop stores said data value and a second access node for holding a complementary version of said data value when said feedback loop stores said data value; an access device for selectively providing a connection between said at least one data line and said first access node; a reset device for selectively providing a connection between said at least one reset line and said second access node; said memory further comprising: data access control circuitry for generating control signals in response to data access requests for independently controlling said access device and said reset device to provide said connections; wherein: said data control circuitry is configured to: generate a data access control signal to trigger said access device to provide said connection between said first access node and said at least one data line in response to a write request to write a predetermined value to said storage cell, and in response to a read request to read a stored value from said storage cell; and generate a reset control signal to trigger said reset device to provide said connection between said at least one reset line and said second access node in response to a write request to write said complementary predetermined value to said storage cell.

The present invention recognises that an asymmetric feedback loop may provide increased robustness to read corruptions, but that it may also be more difficult to write to. It addresses this problem by providing a data line and a reset line rather than the conventional data line and complementary data line. It then provides independent control signals that can independently control access to one side or the other of the feedback loop. Thus, a read is performed by connecting one side of the feedback loop to the data line and a write of one of the values that can be stored is also performed in this way. However, owing to the asymmetry of the feedback loop, which has been designed with read stability in mind, it is difficult to write the other complementary value to this side of the loop. This problem is addressed by connecting the other side of the feedback loop to the reset line and writing the value to this side of the loop. The asymmetry of the loop allows this value to be written and the end result is that the complementary value is stored. Thus, although there is additional overhead in the need for independent control signals, a read robust cell is provided without the need for any other additional components.

In some embodiments, said asymmetric feedback loop is configured such that it switches state in response to receipt of said predetermined value on said first access node and no signal on said second access node more easily than in response to receipt of said complementary predetermined value on said first access node and no signal on said second access node.

In order for the feedback look to retain its data during a read it is set to be asymmetric such that it is read from one side, the side that accesses the first access node and when a signal is input to this side that has a complementary predetermined value the asymmetric feedback loop is resistant to switching.

In some embodiments, said asymmetric feedback loop is configured such that receipt of said predetermined value on said first access node and no signal on said second access node is sufficient to switch a state of said storage cell and receipt of said complementary predetermined value on said first access node and no signal on said second access node will not trigger a switch of state.

The resistance to switching in response to the complementary predetermined value on the first access node may be such that switching of state is never triggered by receipt of this signal on the first access node. The inability to write the complimentary predetermined value to the first access node is addressed by providing the second access node that is accessed via the reset device and this enables the complementary predetermined value to be stored in the storage cell by inputting the predetermined value via this node.

In some embodiments, said memory is configured to write a data value to a selected one of said plurality of storage cells in a two step procedure, such that: in response to a request to write said predetermined value to said selected storage cell said memory is configured to: provide said complementary predetermined value to said reset line and to connect said reset line to said second access node of said selected storage cell by controlling said reset device of said selected storage cell to conduct during a first step; and to provide said predetermined value to said data line and to connect said data line to said first access node of said selected storage cell by controlling said access device of said selected storage cell to conduct during a second step and to thereby cause said selected storage cell to store said predetermined value; and in response to a request to write said complementary predetermined value said memory is configured to: provide said reset line with said predetermined value and to connect said reset line to said second access node by controlling said reset device to conduct during said first step to thereby cause said storage cell to store said predetermined value; and to provide said data line with said predetermined value and to connect said data line to said first access node by controlling said access device during said second step.

The asymmetry of the feedback loop and the separate control signals allowing independent control of the access device and the reset device means that writing to the storage cell may in some embodiments be a two-step procedure. In the first or reset step the reset device is turned on and in the case the complementary predetermined value is to be stored the reset line is held at the predetermined value while the reset device is on and the storage cell will store the complementary predetermined value to the storage cell during this first step. However, the second step is still performed, whereby the access device is switched on and the data line is held at the complementary predetermined value. In order to write the predetermined value the reset step is performed whereby the reset device is switched on and the reset line is held at the complementary predetermined value and then the access device is switched on and as the data line holds the predetermined value the storage cell receives this value and stores it.

Although in some embodiments the first and second steps are performed at the same time in other embodiments the said first step is performed before said second step.

In some embodiments, the predetermined value comprises a logical zero.

Although, the feedback loop can be defined with different asymmetry such that it preferentially receives a different logical value, in some embodiments it will be able to switch state in response to receiving a logical 0 and not a logical 1 on the data line. Generally, the resistance to switching in response to a logical 1 will help reduce read disturb and thus, this is a convenient way to arrange the circuit.

In some embodiments, said plurality of storage cells comprise six transistors, four of said transistors being configured to form said feedback loop, one of said transistors forming said access device and one of said transistors forming said reset device, said access device providing a higher resistance connection to said data line than said reset device provides to said reset line.

Although, the storage cell can be made in a number of ways, an area efficient way of forming it is to form it out of six transistors, four of the transistors forming the feedback loop and the other two forming the access device and the reset device respectively. It has been found to be advantageous if the access device provides a higher resistance connection to the data line than the reset device provides to the reset line. This is because the access device is used for reading as well as writing and thus, it is advantageous for it to have a higher resistance as this inhibits read disturb. The reset device is only used for writing one of the values and thus, a low resistance will improve writing speeds.

In some embodiments, said feedback loop comprises a first pmos transistor connected between said high voltage level and said first access node and a first nmos transistor connected between said first access node and said low voltage level, a second pmos transistor connected between said high voltage level and said second access node and a second nmos transistor connected between said second access node and said low voltage level, said first nmos transistor being wider than said second nmos transistor.

One particularly convenient arrangement of the storage cell that provides the desired asymmetry is to have the side of the feedback loop comprising a first access node to be n-strong and the side comprising the second access node to be p-strong. This can be done by appropriate sizing of the nmos transistors for example.

In some embodiments, said memory comprises at least one reference storage cell for storing a value that generates discharge currents on access, said reference storage cell being configured to generates discharge currents that are lower than currents generated during a read access to a corresponding one of said plurality of storage cells storing a same value; and a voltage difference detector for detecting a difference in voltage generated by a read current generated by accessing said reference storage cell and a read current generated by accessing a storage cell being read, said voltage difference detector determining from said difference a data value stored in said storage cell.

One potential problem with embodiments of the present invention is that reads are performed by accessing one side of the feedback loop and thus, reading of the data value is performed by sensing the change on the data line that connection of the storage cell to the data line generates. In the case of a conventional 6T cell then reads are performed by connecting either side of the feedback look to a data line and a complementary data line and the difference in the voltage is measured. Thus, in the current case the change in voltage that needs to be detected is a half that which would be detected with a conventional cell. This makes detection of the voltage change challenging.

In order to address this problem, in some embodiments a reference storage cell is included within the array, the reference storage cell being weaker than the other storage cells, such that when it stores a value that triggers a current discharge on access, the discharge current is smaller than discharge currents generated by one of the storage cells when it stores this value. The memory also includes a voltage difference detector and thus, rather than detecting a voltage change triggered by the discharge current from a storage cell on access and determining what value it stored, the voltage triggered by the difference in the discharge currents between the reference cell which always stores a certain value and the storage cell are determined and from this it is determined what value is stored.

In some embodiments, said memory comprises a plurality of reference cells and a plurality of voltage difference detectors, wherein: said plurality of storage cells are arranged in an array, having a plurality of columns, and a corresponding plurality of data and reset lines, said array being arranged to have two portions, and each column comprising two reference cells one in a first portion and one in a second portion, wherein each of said data lines is split into a first portion and a second portion, said plurality of voltage difference detectors being arranged between said first and second portions of said plurality of data lines to detect differences in voltage on said two portions of said data line, said memory being configured to read a data value stored in a selected storage cell by comparing a voltage change generated by accessing a selected storage cell with a voltage change generated by accessing said reference cell in a same column and a different portion.

One way of arranging the voltage detectors to detect the difference between the voltage generated by the reference cell access and by the storage cell access is to divide the array into two portions have a reference cell in each of the two portions and to compare the change in voltage on the data line when a storage cell in one portion is accessed with a change in voltage generated on the data line by a reference cell on the other portion. It should be noted that in this scheme, in addition to an increase in read current, the data line capacitance is reduced due to splitting of the data line into two portions.

In some embodiments, said reference cell is accessed via said second access node, said voltage difference detector detecting a difference in voltage generated on said reset line by said access of said reference cell to said second access node and a voltage generated on said data line by said access of said storage cell in response to a read request.

In some embodiments, rather than detecting a voltage difference on a split data line between that generated by the reference cell and that generated by the access storage cell, the reference cell can be accessed via the second access node and the voltage difference between the voltage change generated on the reset line and the voltage change generated on the data line measured instead. This simplifies the design of the array and removes some of the asymmetry in the inputs to the voltage detectors that occur by having them in the centre of the array comparing values from either portion. If the array is still split in two voltage detectors are required for both the top and bottom portions. If the array is not split then the capacitance of the data line may becomes a problem.

In some embodiments, said reference cell comprises an access device with a higher resistance when connecting said feedback loop to said data line than said access device of said storage cell.

A weaker reference cell can be designed by providing it with an access device that has a higher resistance when connecting the feedback loop to the data line than the access device of the storage cell. This will ensure that any currents generated by discharge of this reference cell are smaller than those generated by discharge of the storage cell when they store the same value.

An alternative way of ensuring the reference cell is weaker is to power the reference cell by a lower differential voltage than the storage cells. This can be done by lowering the supply voltage supplied to the reference cell or by raising the ground or low voltage level.

Alternatively, the signal that switches the access device of the reference cell can be reduced such that it is smaller than the signal switching the access device of the storage cell. This will also reduce the discharge currents from the reference cell. In such an embodiment, said memory is configured such that a control signal sent to said reference cell to switch said reference cell access device has a lower voltage than a control signal sent to said storage cell being read to switch said storage cell access device.

In some embodiments, said plurality of storage cells are arranged in an array, having a plurality of columns, and a corresponding plurality of data and reset lines, and a plurality of rows, said data access control signal for controlling switching of said access device being sent to a selected one of said rows, and said reset control signal for controlling switching of said reset device being sent to said selected one of said rows.

The control signals for controlling the switching of the access device and the reset device are independent control signals and are sent down separate lines. In some embodiments they are sent along rows which makes the array simpler to build in the silicon.

In other embodiments, said plurality of storage cells are arranged in an array, having a plurality of columns, and a corresponding plurality of data lines, and a plurality of rows having a corresponding plurality of reset lines, a data access control signal for controlling switching of said access device being sent to a selected one of said rows, and a reset control signal for controlling switching of said reset device being sent to a selected one of said columns.

It may in some cases be advantageous to arrange the array such that the control signals for controlling switching of the access devices are sent along rows in a conventional word reading manner, while the reset control signals for controlling switching of the reset devices are sent along columns. This has the advantage that in a write where the reset device and the access device are both switched on, only one storage cell has both of these access devices switched on in response to this write access, rather than a whole row of cells. This reduces the risk of a cell being disturbed by a write to a different cell.

In some embodiments, said memory is configured to write a data value to a selected one of said plurality of storage cells in a one step procedure, such that in response to a request to write said predetermined value to said selected storage cell said memory is configured to: provide said complementary predetermined value to said reset line and to connect said reset line to said second access node of said selected storage cell by controlling said reset device of said selected storage cell and to provide said predetermined value to said data line and to connect said data line to said first access node of said selected storage cell by controlling said access device of said selected storage cell to conduct and to thereby cause said selected storage cell to store said predetermined value; and in response to a request to write said complementary predetermined value said memory is configured to: provide said reset line with said predetermined value and to connect said reset line to said second access node by controlling said reset device to conduct to thereby cause said storage cell to store said predetermined value.

This selection of a individual storage cell by arranging the control signals for the access device along rows and the control signal to the reset device along columns means that a one stage procedure can be performed in which the reset line and data line are connected to the storage cell at the same time.

A second aspect of the present invention provides a method of storing and accessing data in a static random access memory, said memory comprising a plurality of storage cells comprising an asymmetric feedback loop, said feedback loop comprising a first access node for holding a data value when said feedback loop stores said data value and a second access node for holding a complementary version of said data value when said feedback loop stores said data value, an access device for providing a data connection between said first access node and a data line and a reset device for providing a data connection between said second access node and a reset line, said method comprising the steps of: in response to a write request to write a predetermined value to said storage cell or a read request to read a stored value from said storage cell: generating a data access control signal to control said access device to provide said data connection between said first access node and said data line, and in response to a read request to read a stored value from said storage cell; and in response to a write request to write said complementary predetermined value to said storage cell: generating a reset control signal to control said reset device to provide said connection between said reset line and said second access node.

A third aspect of the present invention provides a static random access storage memory, comprising: at least one data transferring means for transferring data to and from said memory and at least one reset signal transferring means; a plurality of storage means each being arranged for connection to said at least one data transferring means and said at least one reset signal transferring means, each storage means comprising: an asymmetric feedback loop, said feedback loop comprising a first access node means for holding a data value when said feedback loop stores said data value and a second access node means for holding a complementary version of said data value when said feedback loop stores said data value; an access means for selectively providing a connection between said data transferring means and said first access node means; a reset means for selectively providing a connection between said reset signal transferring means and said second access node means; said memory further comprising: data access control means for generating control signals in response to data access requests for independently controlling said access means and said reset means to provide said connections; wherein: said data control means is configured to: generate a data access control signal to trigger said access means to provide said connection between said first access node means and said data transferring means in response to a write request to write a predetermined value to said storage means, and in response to a read request to read a stored value from said storage means; and generate a reset control signal to trigger said reset means to provide said connection between said reset signal transferring means and said second access node means in response to a write request to write said complementary predetermined value to said storage means.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 3:
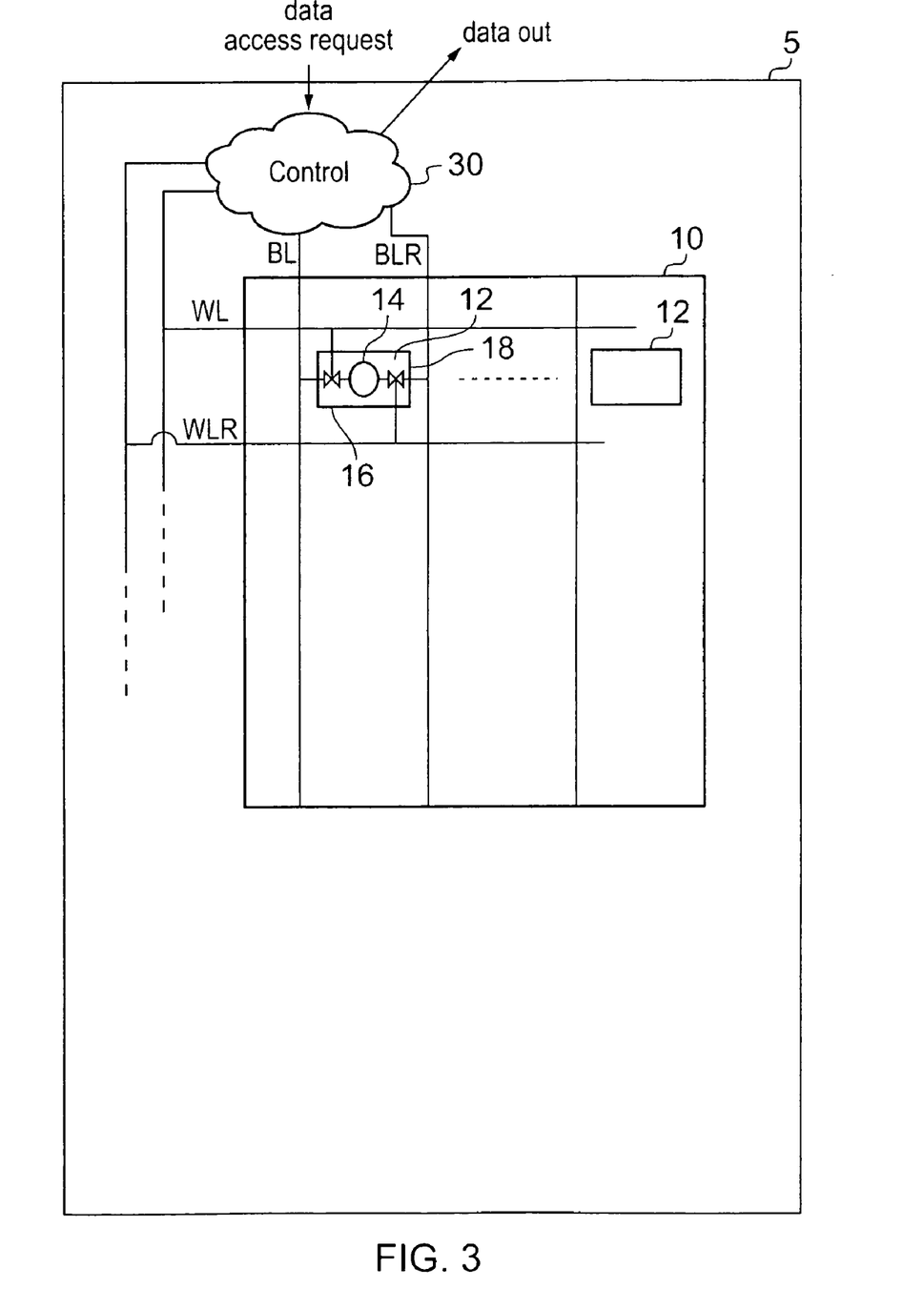
FIG. 3 shows a SRAM memory according to an embodiment of the present invention.

FIG. 3 shows an SRAM memory 5 according to an embodiment of the present invention. Memory 5 comprises an array 10 of storage cells 12, each storing a data value.

These storage cells 12 comprise a storage feedback loop 14, a data access switch 16 and a reset switch 18. The data access switch 16 provides access to the feedback loop from the bit line BL while reset switch 18 provides access to the feedback loop from the reset line BLR. These two switches are controlled by control signals sent along word line WL and reset line WLR. These signals are generated by control circuitry 30 in response to data access requests received from a processor. If the request is a read request then data is output by detecting changes on the data line BL.

Figure 4:
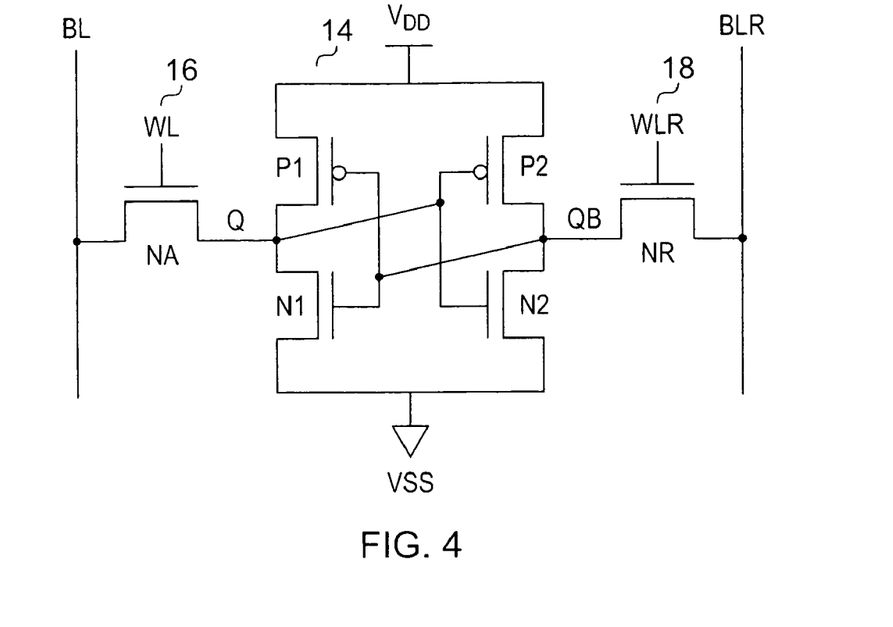
FIG. 4 shows a storage cell according to an embodiment of the present invention.

FIG. 4 shows the storage cell 12 in greater detail. In this embodiment, the storage cell is a 6 transistor 6T cell in which the data access switch 16 is a transistor controlled by a signal on the word line WL while the reset switch 18 is a transistor controlled by a signal received along the reset line WLR. The feedback loop 14 is an asymmetric 4 transistor feedback loop. The asymmetry of the feedback loop has been designed such that when reading from this feedback loop the loop is resistant to corruption of the data. Forming a feedback loop that is asymmetric in this way has a disadvantage in that it makes it difficult to write a 1 to, as the asymmetry of the feedback loop has been designed such that receipt of a one from the bit line via access device 16 does not easily trigger a switch in state.

This has been addressed in this embodiment by providing the reset line BLR and the reset transistor 18. If a request to store a 1 in a storage cell is received, then rather than transmitting the 1 to the bit line and sending it via access transistor 16, the reset line is set to 0 and this 0 is sent to the feedback loop 14 via reset device 18. A 0 received on this side of the feedback loop is sufficient to trigger the loop to switch state if required and a 1 is then stored.

Thus, the cell has been designed such that it is read via access transistor 16 but is resistant to switching state if a 1 is received via this access transistor. Reset transistor 18 has been provided to allow a 0 to be written from the other side when it is desired to store a 1 in the feedback loop 14.

The asymmetric sizing in this embodiment is performed by making the inverter P1-N1 N-strong by increasing the width of the N1 transistor as compared to a conventional symmetric feedback loop. Inverter P2-N2 is made P-strong by reducing the width of transistor N2. The access transistor 16 and reset transistor 18 are increased in size to improve the write noise margin. It should be noted that the reduction in the width of the N2 transistor compensates for the increase in widths of the N1 and access transistor 16 and helps keep a similar area to a conventional 6T cell.

Figure 5:
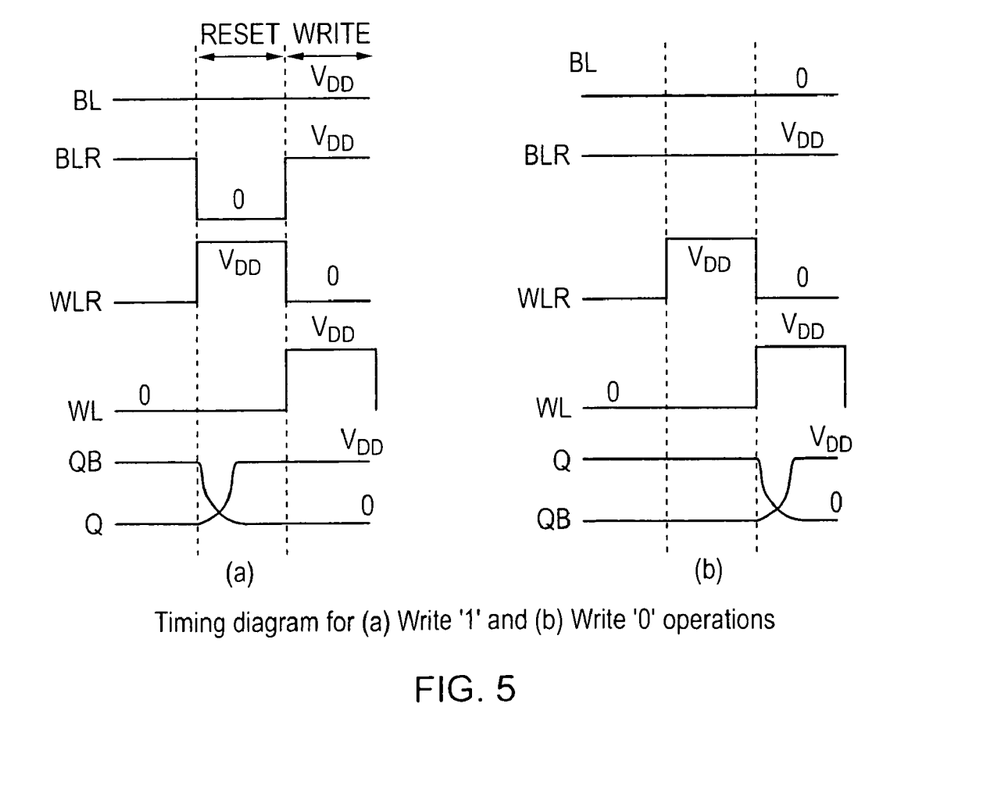
FIG. 5 shows a timing diagram for writing a 1 and for writing a 0 to a storage cell of an embodiment of the present invention.

FIG. 5 shows a timing diagram for writing a 1 and for writing a 0 to the storage cell illustrated in FIG. 4. In this embodiment a write is performed in a two-stage manner. In the first, reset stage the reset line WLR is pulsed high turning on the reset transistor 18. When a 1 is to be written the reset line BLR pulses low at the same time and the feedback loop stores a 1. When a 0 is to be written the reset line stays high and the feedback loop is not affected. In the second stage the word line WL goes high and the bit line BL is driven low for the cells where a 0 needs to be written. Thus, the write 0 operation happens. During the write 1, the word line goes high and the storage cell retains its stored 1.

Figure 6:
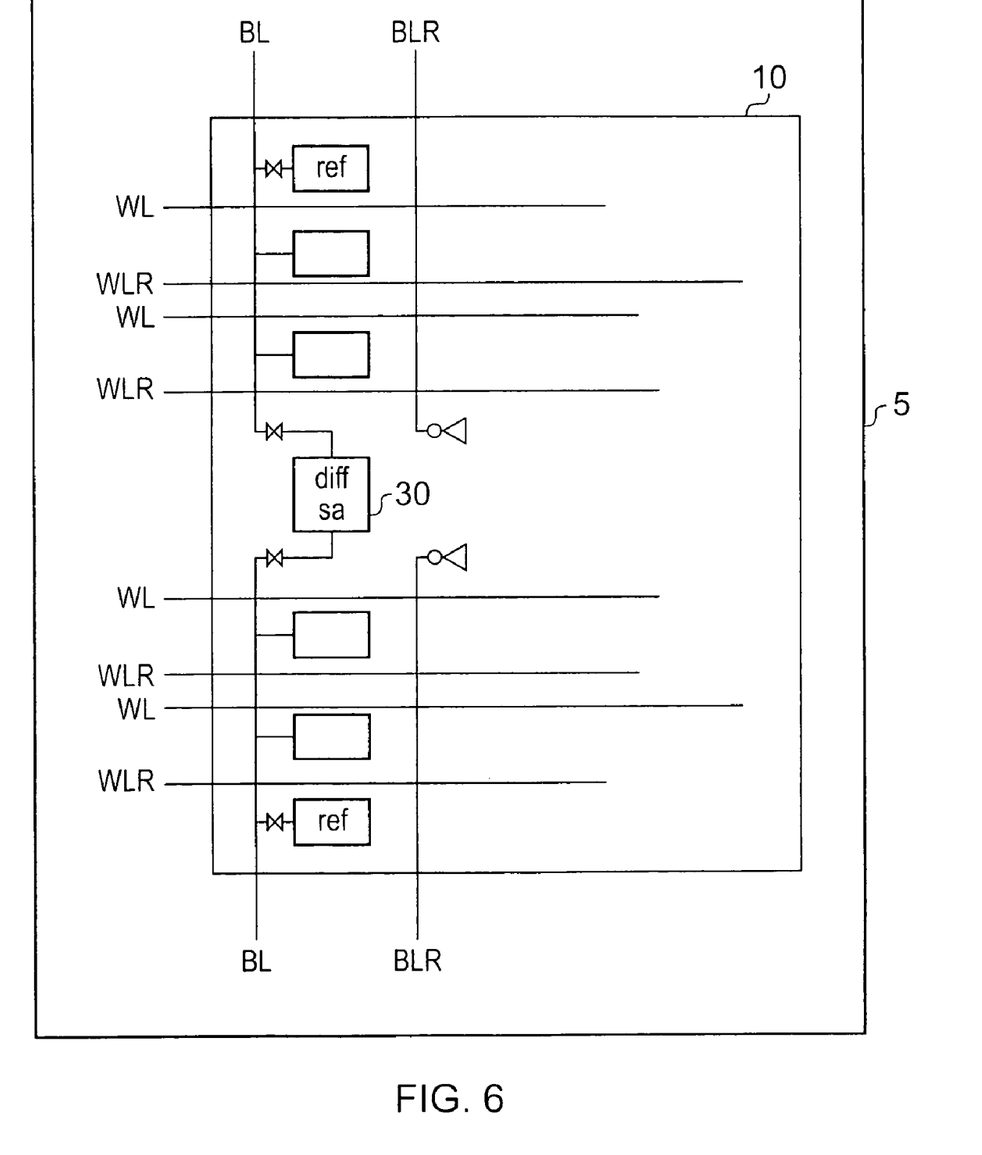
FIG. 6 shows an SRAM memory with a read sensitivity increased according to an embodiment of the present invention.

One disadvantage of embodiments of the present invention is that the storage cell is read from one side and thus, changes in voltage or current flow on the bit line need to be detected rather than changes in voltage or current flow between the bit line and the complementary bit line. Thus, the change detected is a half of what one would generally detect. FIG. 6 shows a SRAM memory 5 according to an embodiment of the present invention where this problem of a reduced read level voltage change is addressed. In this embodiment, the array is split into two portions and the sensing mechanism is in this case a differential sense amplifier 30 arranged between the two portions. The bit line is split into two and each of the two portions comprises a reference storage cell. The reference storage cell is designed to be weaker than the other storage cells. In response to a read signal, the indicated storage cell is accessed and the reference cell in the opposite half of the array is also accessed, the reference cell always stores a 0 and thus, it will always discharge the bit line when connected to it. The difference in the discharge value of that bit line and the discharge value of the bit line connected to the storage cell is then compared and the sense amplifier determine what value was stored. It should be noted that the reset line could be a single reset line, however its capacitance is very large and thus, if the array is being organised in this way it is generally divided into two parts, the two parts having their own driver circuit.

Figure 7:
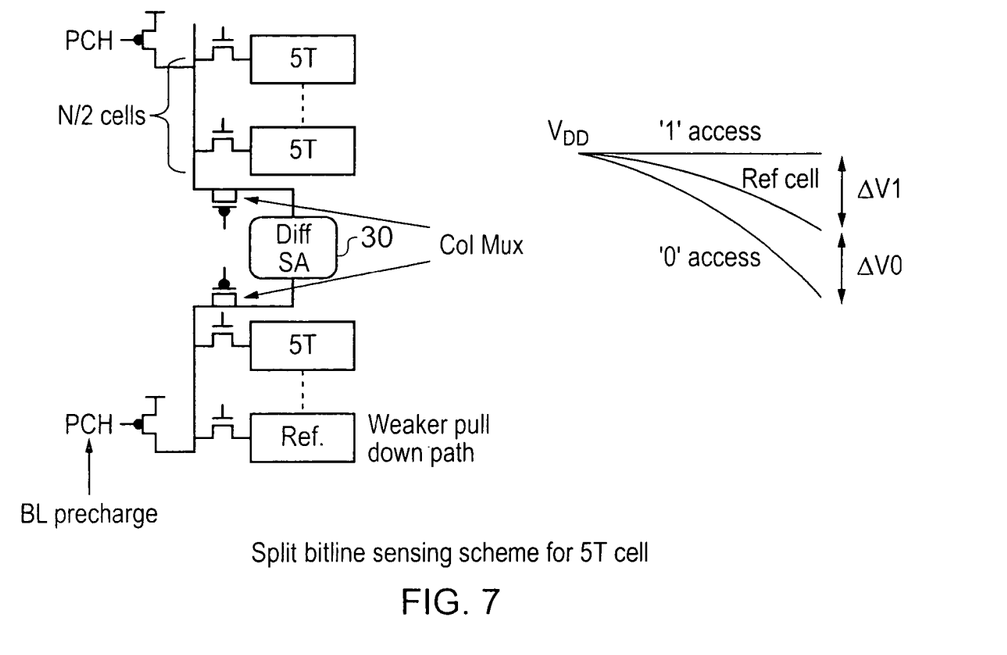
FIG. 7 shows a portion of the memory of FIG. 6 and a timing diagram.

FIG. 7 shows in more detail, a portion of the circuit shown in FIG. 6 and the difference in the voltage levels on the bit lines generated by access to the storage cell when it stores a 0 and a storage cell when it stores a 1 as compared to the reference cell. In FIG. 7 the cell being read is in the top half of the array and the word line of the access row is activated along with the word line of the reference row on the opposite side of the sense amplifier 30. If the cell being read stores a 0 it discharges the corresponding bit line faster than the reference cell as is shown by curve marked 0 in the Figure. On the other hand, if the cell being read stores a high value the bit line does not discharge as is indicated by the curve marked 1 in the Figure. The reference cell on the other side discharges as before. Thus, an appropriate differential is developed which is quickly resolved by the sense amplifier 30 and from the differential voltage the sense amplifier determines whether a 0 or a 1 was stored in the access storage cell. The weaker reference cell is designed to produce a low read current and thus pull the voltage down more slowly. This may be done by using a lower word line voltage for this cell or by designing the cell such that the access transistor to the storage loop has a higher resistance than is the case with a normal storage cell.

It should be noted that in addition to an increase in the read current this design reduces the bit line capacitance as the bit line connects to a lower number of cells. This helps compensate for the fact that the bit line needs to be discharged twice as much to generate the same detectable voltage difference as is the case when one is measuring the difference between the bit line and the complementary bit line.

It should be noted that in although the bit cell is shown as a 5T bit cell, it is the same bit cell as that shown in FIG. 4, which is described in some instances as a 5T bit cell as the reset transistor only plays a role in assisting the write.

Figure 8:
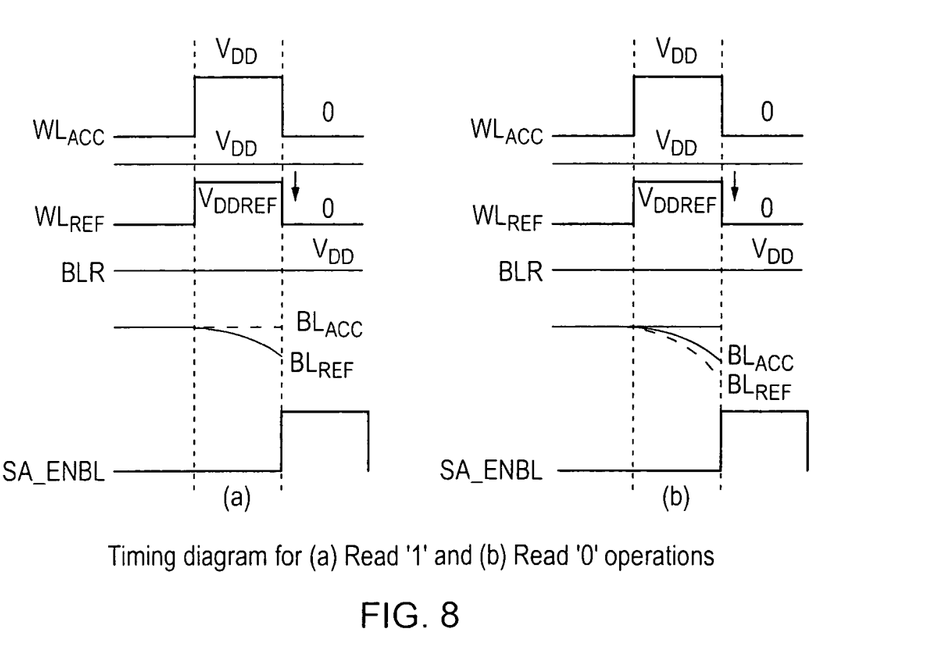
FIG. 8 shows a timing diagram of the circuit of FIG. 6 and FIG. 7 for reads.

FIG. 8 shows a timing diagram for the read operation. The word line of the access cell $WL_{acc}$ and that of the reference cell coupled to $WL_{ref}$ go high. $WL_{ref}$ only goes up to $V_{ddref}$ which is lower than $V_{dd}$ to reduce the read current to the reference cell. It should be noted that 0 should be written to all the reference rows for the sensing to work. A voltage differential then develops as was previously described and once sufficient differential is developed to overcome the sense amplifiers offset and the strobe delay variation SA/ENBL, the differential sense amplifier is fired and resolved to the value stored in the cell.

Figure 9:
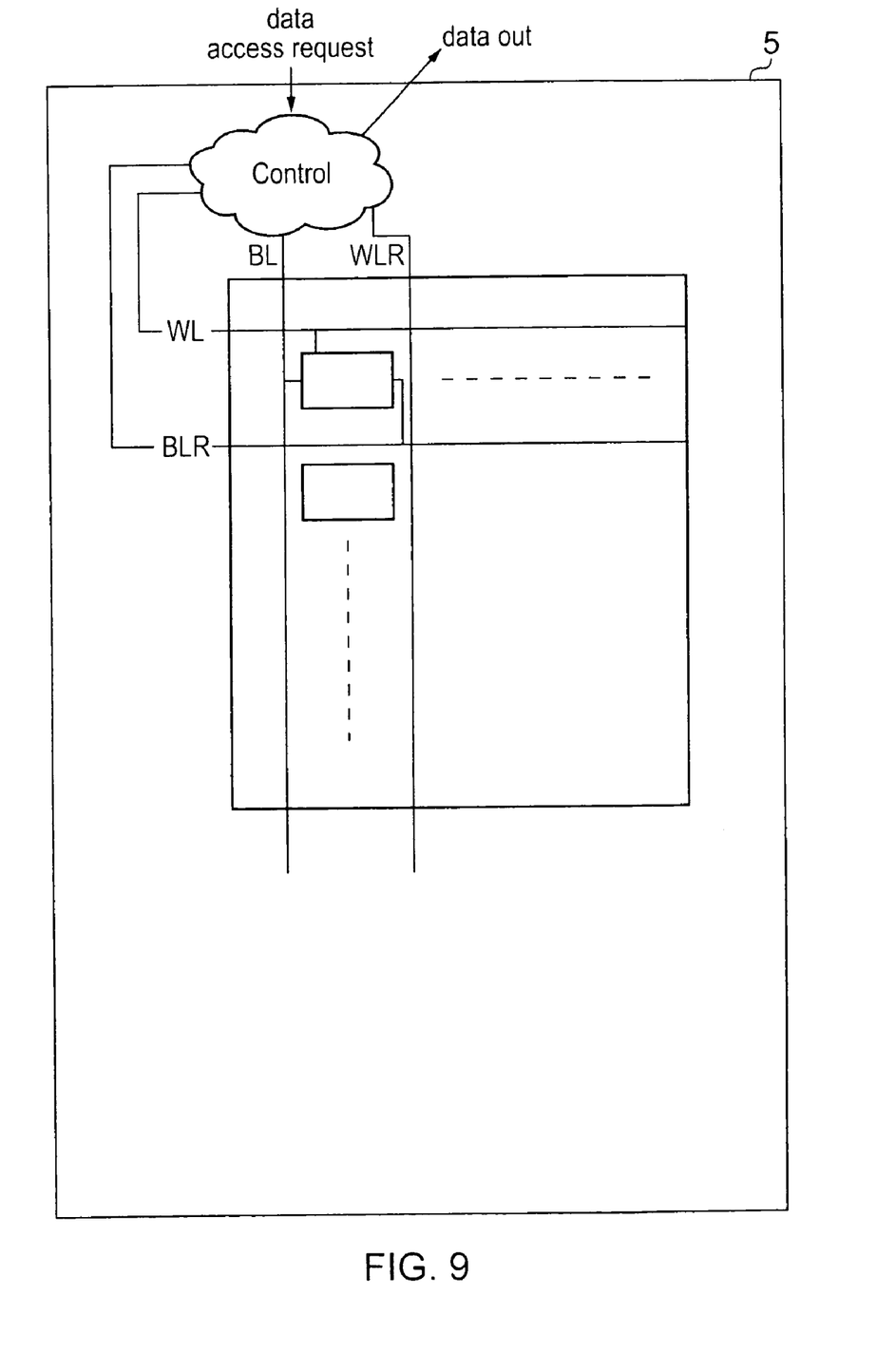
FIG. 9 shows an alternative embodiment of an SRAM.

FIG. 9 shows an alternative embodiment of the present invention where instead of sharing the reset control line WLR along the rows and the reset line BLR along the columns as was disclosed previously these are instead shared along the columns and the rows respectively. Thus, as can be seen in FIG. 9 each cell has a bit line BL on one side and the control line WLR for the reset control signal on the other side and the word line runs along a row of cells while the reset line BLR also runs along the row of cells.

Figure 10:
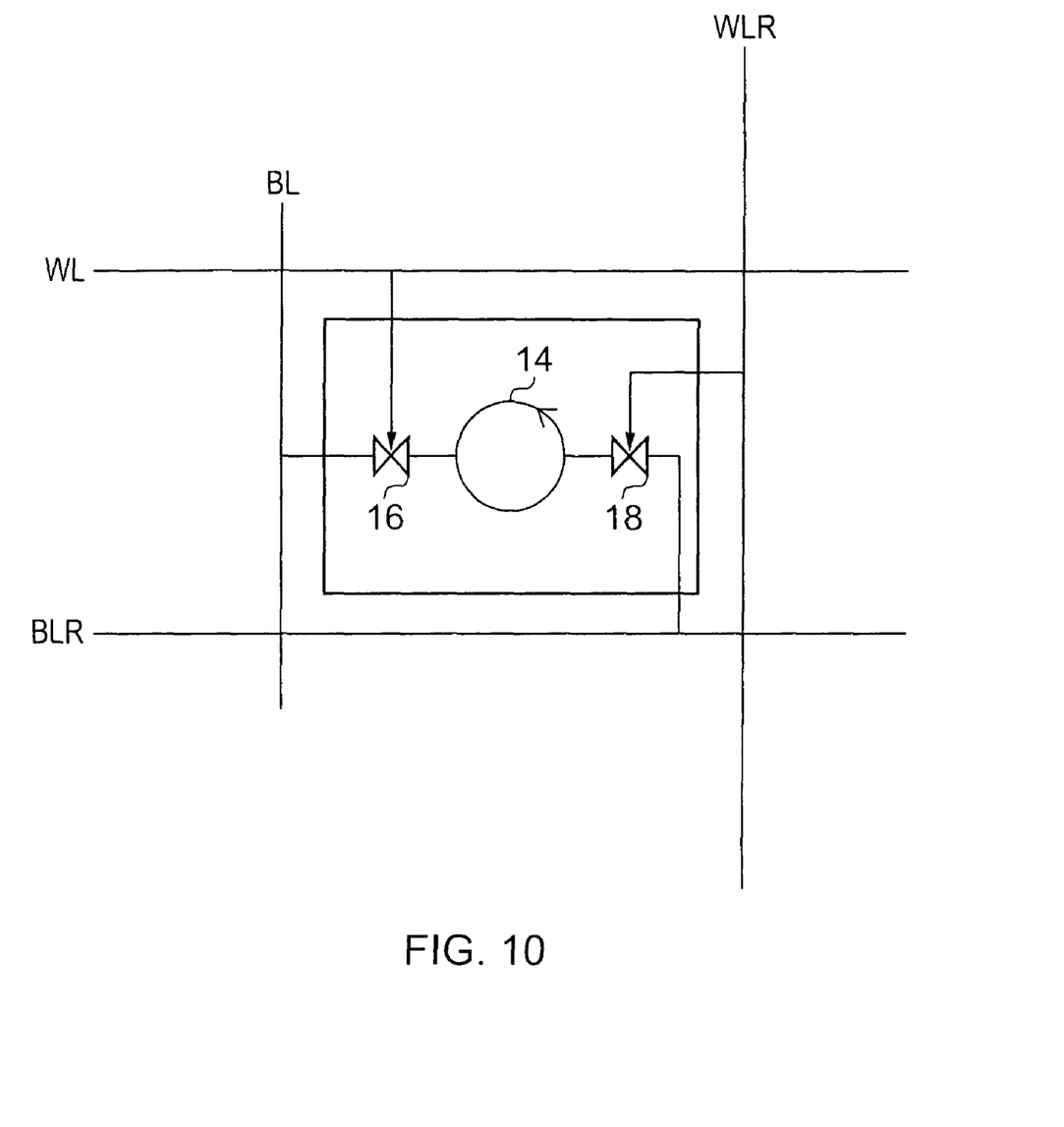
FIG. 10 shows a storage cell of the SRAM memory of FIG. 9.

FIG. 10 shows how these are connected within a storage cell, thus the word line controls access device 16 while the reset control line which is now running along a column controls reset switch 18. Access device 16 controls access of the bit line which runs along a column to this feedback loop while reset control signal WLR controls reset device 18 to provide a connection to the reset line BLR which now runs along a row.

Arranging the array in this way increases cell area compared to a conventional arrangement since the reset control line WLR can no longer be shared with the adjacent cells on the row and the reset line BLR cannot be shared with the adjacent cells on the column. However, one advantage of this is that selection by the word line of a row of cells and by the reset line of a column means that only a single cell can have both of the transistors 16 and 18 switched on in a single access. This eliminates the half select issue of such arrays by ensuring that only the cells in the exact row and columns that are being written to are activated. This allows the minimum voltage at which the storage array can function successfully to potentially be lowered. Furthermore, it allows a 1 to be written to the cell in a single cycle rather than in a double cycle as in the other embodiments. Thus, to write a 1 the reset line is set to 0 and the bit line is set to 1 and the word line and reset control signal line WLR are fired at the same time.

Figure 11:
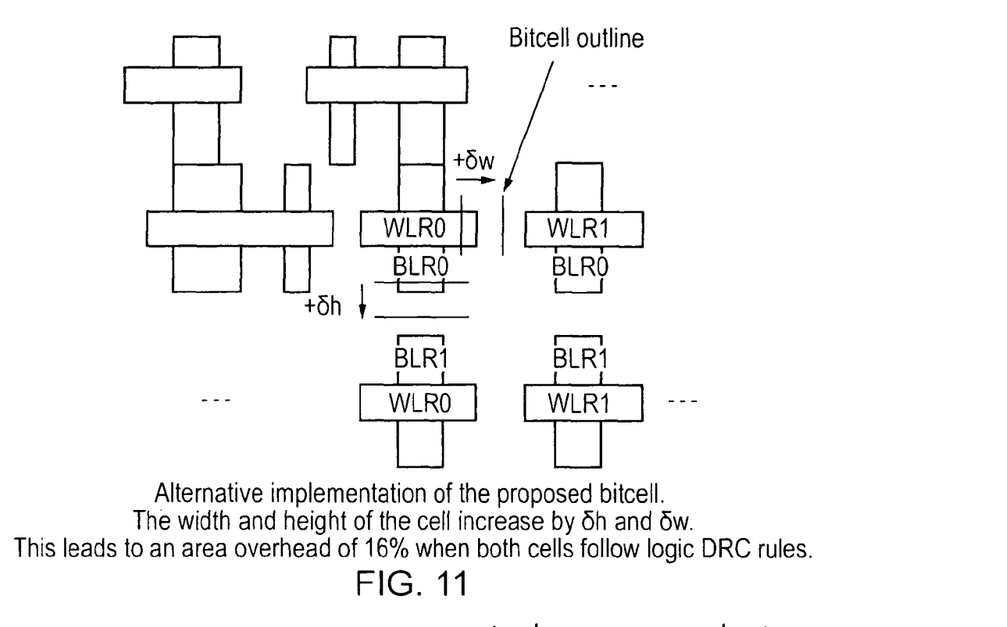
FIG. 11 shows in layout form alternative implementations of the proposed bit cell and the increased area that the design of FIGS. 9 and 10 would trigger.

FIG. 11 shows how the width and height of the cell increases by δH and δW by arranging the bit lines reset lines and control lines in this way. This leads to an area overhead of about 16%.

Figure 12:
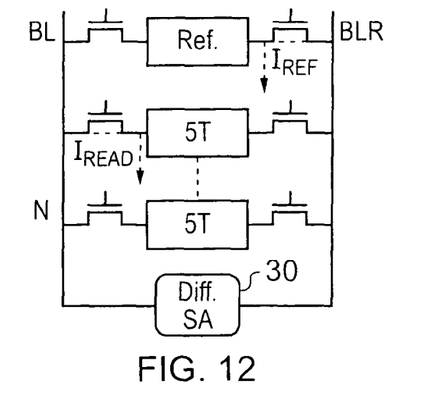
FIG. 12 shows an alternative sensing mechanism for sensing a read access.

FIG. 12 shows an alternative arrangement of reference cells to improve read current and make it easier for the sense amplifiers to detect a voltage difference. In this embodiment, instead of dividing the array into different portions and detecting differences on the bit lines in either portion of the array, the reference cell is accessed via the reset line and the sense amplifier detects the change in voltage level between the bit line and the reset line. This simplifies the design of the array and eliminates asymmetry in the inputs to the sense amplifiers introduced by the input and output buffers and logic in the centre of the array. However, it has a disadvantage in that if the array is divided in two then two sense amplifiers are required and if the array is not divided in two then the capacitance of the bit lines is very large which increases the delay of sensing. In order to address this delay, the system would need to be re-designed to provide additional read current.

Figure 13:
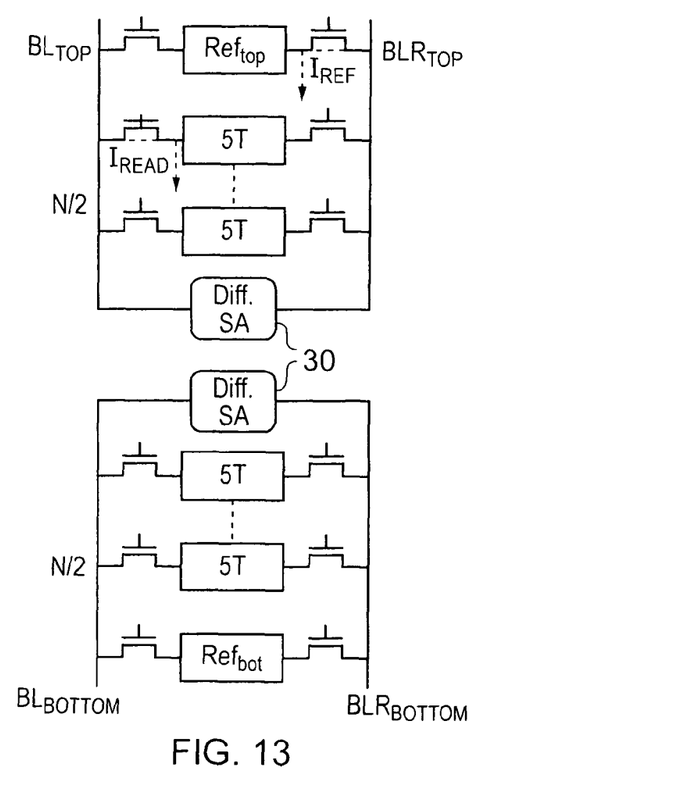
FIG. 13 shows an alternative to that of FIG. 12.

FIG. 12 shows an embodiment where there is one reference cell and one sense amplifier circuit in the array while FIG. 13 shows the memory split into two with two reference cells and two sense amplifiers.

As was noted previously, the reference cell could be rendered weak by under driving the word line voltage or it could be designed as a separate weak cell. Re-designing it reduces the effect of variations due to a lower voltage. In addition, the cell can be weakened by increasing the length of the pass gate or access device which further alleviates the impact of variation. The disadvantage is the increase in design complexity that this brings since a new cell that is sufficiently weak across different design points needs to be designed.

Figure 14:
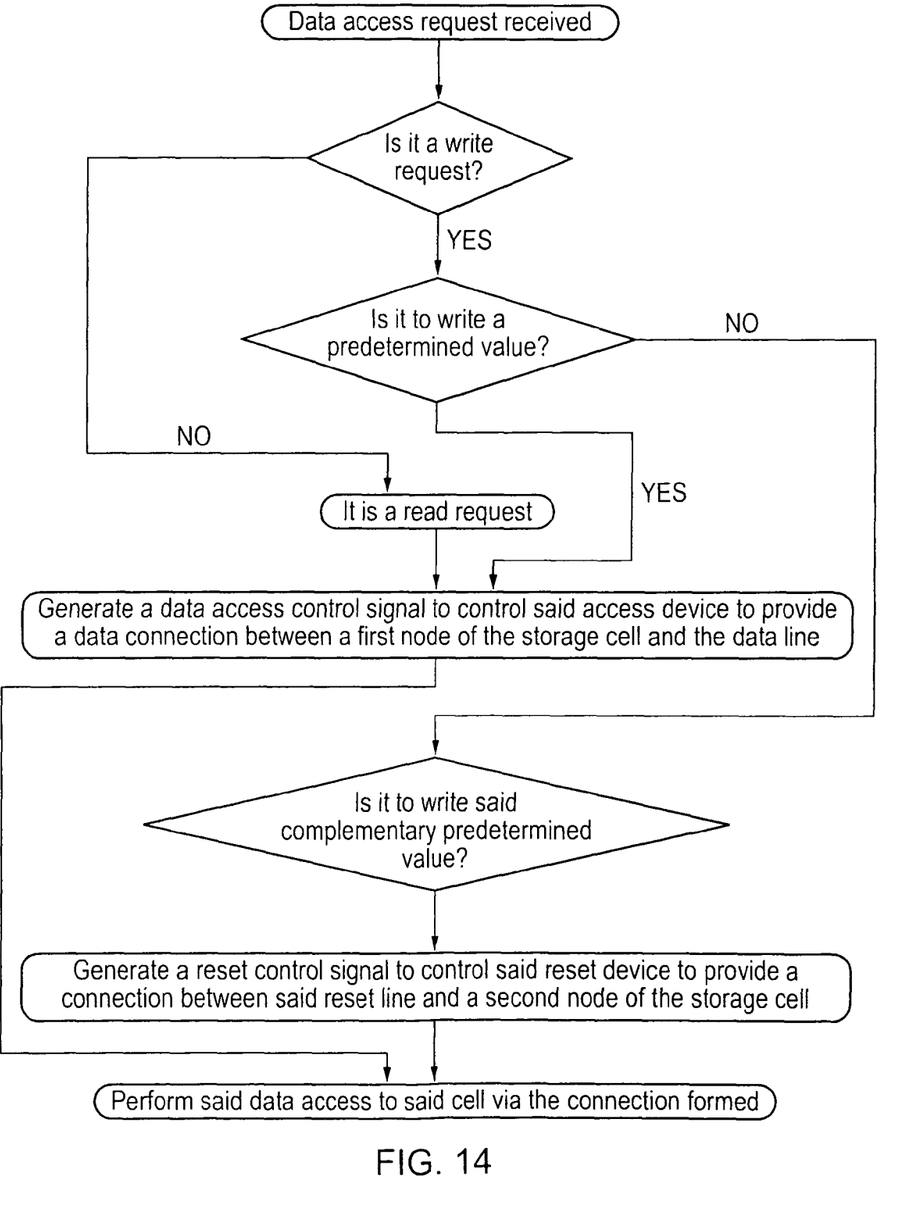
FIG. 14 shows a flow diagram illustrating the steps in a method according to an embodiment of the present invention.

FIG. 14 shows a flow diagram illustrating a method of accessing a storage cell according to an embodiment of the present invention. A data access request is received and it is determined if it is a write request or not. If it is a write request it is then determined if it is to write a predetermined value. If it is not a write request then it is a read request. In response to a read request or a write request to write a predetermined value, a data access control signal is generated to open an access device to provide access between a first node of the storage cell and the data line. The stored value can then be output to the data line in the case of a read, or the predetermined value held by the data line can be stored in the cell in the case of the write.

Where the write is to write the complementary predetermined value then a reset control signal is generated and the reset device is opened providing a connection between the reset line and the storage cell, the reset line holds the predetermined value so that the complementary predetermined value is stored in response to the connection being formed.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, various combinations of the features of the following dependent claims could be made with the features of the independent claims without departing from the scope of the present invention.

We claim:

1. A static random access memory, comprising:
   at least one data line for transferring data to and from said memory and at least one reset line;
   a plurality of storage cells each being arranged for connection to said at least one data line and said at least one reset line, each storage cell comprising:
      an asymmetric feedback loop, said feedback loop comprising a first access node for holding a data value when said feedback loop stores said data value and a second access node for holding a complementary version of said data value when said feedback loop stores said data value;
      an access device for selectively providing a connection between said at least one data line and said first access node;
      a reset device for selectively providing a connection between said at least one reset line and said second access node; said memory further comprising:
   data access control circuitry for generating control signals in response to data access requests for independently controlling said access device and said reset device to provide said connections; wherein:
   said data control circuitry is configured to:
      generate a data access control signal to trigger said access device to provide said connection between said first access node and said at least one data line in response to a write request to write a predetermined value to said storage cell, and in response to a read request to read a stored value from said storage cell; and
      generate a reset control signal to trigger said reset device to provide said connection between said at least one reset line and said second access node in response to a write request to write said complementary predetermined value to said storage cell, wherein said asymmetric feedback loop is configured such that it switches state in response to receipt of said predetermined value on said first access node and no signal on said second access node more easily than in response to receipt of said complementary predetermined value on said first access node and no signal on said second access node.

2. A memory according to claim 1, wherein said asymmetric feedback loop is configured such that receipt of said predetermined value on said first access node and no signal on said second access node is sufficient to switch a state of said storage cell and receipt of said complementary predetermined value on said first access node and no signal on said second access node will not trigger a switch of state.

3. A memory according to claim 1, said memory being configured to write a data value to a selected one of said plurality of storage cells in a two step procedure, such that:
   in response to a request to write said predetermined value to said selected storage cell said memory is configured to:
      provide said complementary predetermined value to said reset line and to connect said reset line to said second access node of said selected storage cell by controlling said reset device of said selected storage cell to conduct during a first step; and
      to provide said predetermined value to said data line and to connect said data line to said first access node of said selected storage cell by controlling said access device of said selected storage cell to conduct during a second step and to thereby cause said selected storage cell to store said predetermined value; and
   in response to a request to write said complementary predetermined value said memory is configured to:
      provide said reset line with said predetermined value and to connect said reset line to said second access node by controlling said reset device to conduct during said first step to thereby cause said storage cell to store said complementary predetermined value; and
      to provide said data line with said complementary predetermined value and to connect said data line to said first access node by controlling said access device during said second step.

4. A memory according to claim 3, wherein said first step is performed before said second step.

5. A memory according to claim 1, wherein said predetermined value comprises a logical zero.

6. A memory according to claim 1, wherein said plurality of storage cells comprise six transistors, four of said transistors being configured to form said feedback loop, one of said transistors forming said access device and one of said transistors forming said reset device, said access device providing a higher resistance connection to said data line than said reset device provides to said reset line.

7. A memory according to claim 2, wherein said feedback loop comprises a first pmos transistor connected between said high voltage level and said first access node and a first nmos transistor connected between said first access node and said low voltage level, a second pmos transistor connected between said high voltage level and said second access node and a second nmos transistor connected between said second access node and said low voltage level, said first nmos transistor being wider than said second nmos transistor.

8. A memory according to claim 1, said memory comprising:
  at least one reference storage cell for storing a value that generates discharge currents on access, said reference storage cell being configured to generate discharge currents that are lower than currents generated during a read access to a corresponding one of said plurality of storage cells storing a same value; and
  a voltage difference detector for detecting a difference in voltage generated by a read current generated by accessing said reference storage cell and a read current generated by accessing a storage cell being read, said voltage difference detector determining from said difference a data value stored in said storage cell.

9. A memory according to claim 8 said memory comprising a plurality of reference cells and a plurality of voltage difference detectors, wherein:
  said plurality of storage cells are arranged in an array, having a plurality of columns, and a corresponding plurality of data and reset lines, said array being arranged to have two portions, and each column comprising two reference cells one in a first portion and one in a second portion, wherein each of said data lines is split into a first portion and a second portion, said plurality of voltage difference detectors being arranged between said first and second portions of said plurality of data lines to detect differences in voltage on said two portions of said data line, said memory being configured to read a data value stored in a selected storage cell by comparing a voltage change generated by accessing a selected storage cell with a voltage change generated by accessing said reference cell in a same column and a different portion.

10. A memory according to claim 8, wherein said reference cell is accessed via said second access node, said voltage difference detector detecting a difference in voltage generated on said reset line by said access of said reference cell to said second access node and a voltage generated on said data line by said access of said storage cell in response to a read request.

11. A memory according to claim 8, wherein said reference cell comprises an access device with a higher resistance when connecting said feedback loop to said data line than said access device of said storage cell.

12. A memory according to claim 8, said memory being configured such that a control signal sent to said reference cell to switch said reference cell access device has a lower voltage than a control signal sent to said storage cell being read to switch said storage cell access device.

13. A memory according to claim 8, said memory being configured such that said reference cell is powered by a lower differential voltage than said storage cells.

14. A memory according to claim 1, wherein said plurality of storage cells are arranged in an array, having a plurality of columns, and a corresponding plurality of data and reset lines, and a plurality of rows, said data access control signal for controlling switching of said access device being sent to a selected one of said rows, and said reset control signal for controlling switching of said reset device being sent to said selected one of said rows.

15. A memory according to claim 1, wherein said plurality of storage cells are arranged in an array, having a plurality of columns, and a corresponding plurality of data lines, and a plurality of rows having a corresponding plurality of reset lines, a data access control signal for controlling switching of said access device being sent to a selected one of said rows, and a reset control signal for controlling switching of said reset device being sent to a selected one of said columns.

16. A memory according to claim 15, wherein said memory is configured to write a data value to a selected one of said plurality of storage cells in a one step procedure, such that in response to a request to write said predetermined value to said selected storage cell said memory is configured to:
  provide said complementary predetermined value to said reset line and to connect said reset line to said second access node of said selected storage cell by controlling said reset device of said selected storage cell and to provide said predetermined value to said data line and to connect said data line to said first access node of said selected storage cell by controlling said access device of said selected storage cell to conduct and to thereby cause said selected storage cell to store said predetermined value; and
  in response to a request to write said complementary predetermined value said memory is configured to:
  provide said reset line with said predetermined value and to connect said reset line to said second access node by controlling said reset device to conduct and to thereby cause said storage cell to store said complementary predetermined value.

* * * * *